United States Patent [19]

Iinuma

[11] Patent Number: 5,757,940

[45] Date of Patent: May 26, 1998

[54] ELECTRIC VOLUME CONTROLLER

[75] Inventor: Nobuharu Iinuma, Kawasaki, Japan

[73] Assignee: Fujitsu Limited, Kawasaki, Japan

[21] Appl. No.: 822,763

[22] Filed: Mar. 24, 1997

Related U.S. Application Data

[63] Continuation of Ser. No. 371,807, Jan. 12, 1995, abandoned.

[30] Foreign Application Priority Data

Jan. 24, 1994 [JP] Japan .................................. 6-005532

[51] Int. Cl.$^6$ ........................................................ H03G 3/00
[52] U.S. Cl. .......................................... 381/104; 381/94.5
[58] Field of Search .................................. 381/104, 105, 381/106, 94.1, 94.5, 107, 109; 455/267, 200.1

[56] References Cited

U.S. PATENT DOCUMENTS 4,420,694   12/1983   Yokota ............................... 455/212

FOREIGN PATENT DOCUMENTS 60-28310   2/1985   Japan .

61-261905   11/1988   Japan ............................... 381/104

*Primary Examiner*—Minsun Oh Harvey
*Attorney, Agent, or Firm*—Armstrong, Westerman, Hattori, McLeland & Naughton

[57] ABSTRACT

An electronic volume controller includes a resistor circuit receiving an input signal and outputting an output signal and having a variable resistance, a switch control circuit controlling the resistance of the resistor circuit depending on resistance selection signals when activated in response to a select signal, and a mute circuit receiving the output signal of the resistor circuit and producing an output signal. The mute circuit mutes the output signal of the resistor circuit at least during one of times selected from a group consisting of a time when the switch control circuit is activated in response to the select signal to change the resistance of the resistor circuit depending on the resistance selection signals, a time when the switch control circuit is activated in response to the select signal to select a maximum resistance of the resistor circuit depending on the resistance selection signals, and a time when a level of the input signal is approximately zero.

9 Claims, 9 Drawing Sheets

→ TIME

→ TIME

→ TIME

ELECTRIC VOLUME CONTROLLER

This application is a continuation of application Ser. No. 08/371,807 filed Jan. 12, 1995, now abandoned.

BACKGROUND OF THE INVENTION

The present invention generally relates to electronic volume controllers, and more particularly to an electronic volume controller that is suited for use in an acoustic equipment or the like and varies the resistance by rewriting a resistor of a switching control circuit. The electronic volume controller is basically a variable resistor unit.

Figure 1:
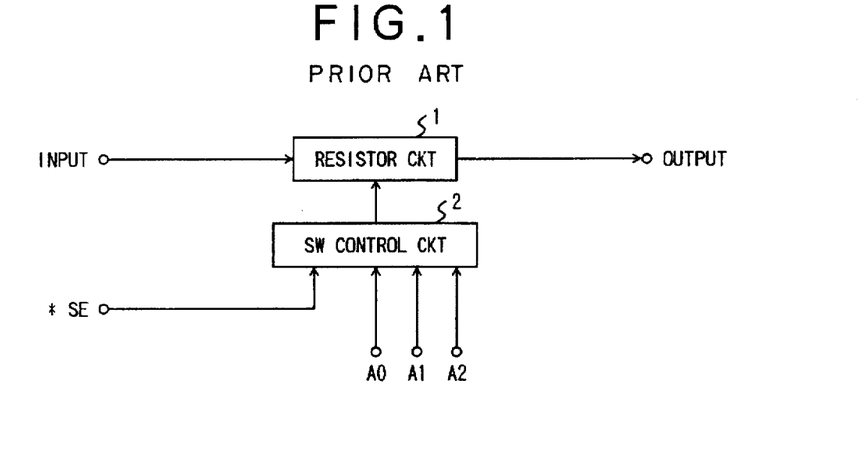
FIG. 1 is a system block diagram showing an example of a conventional electronic volume controller.
Figure 2:
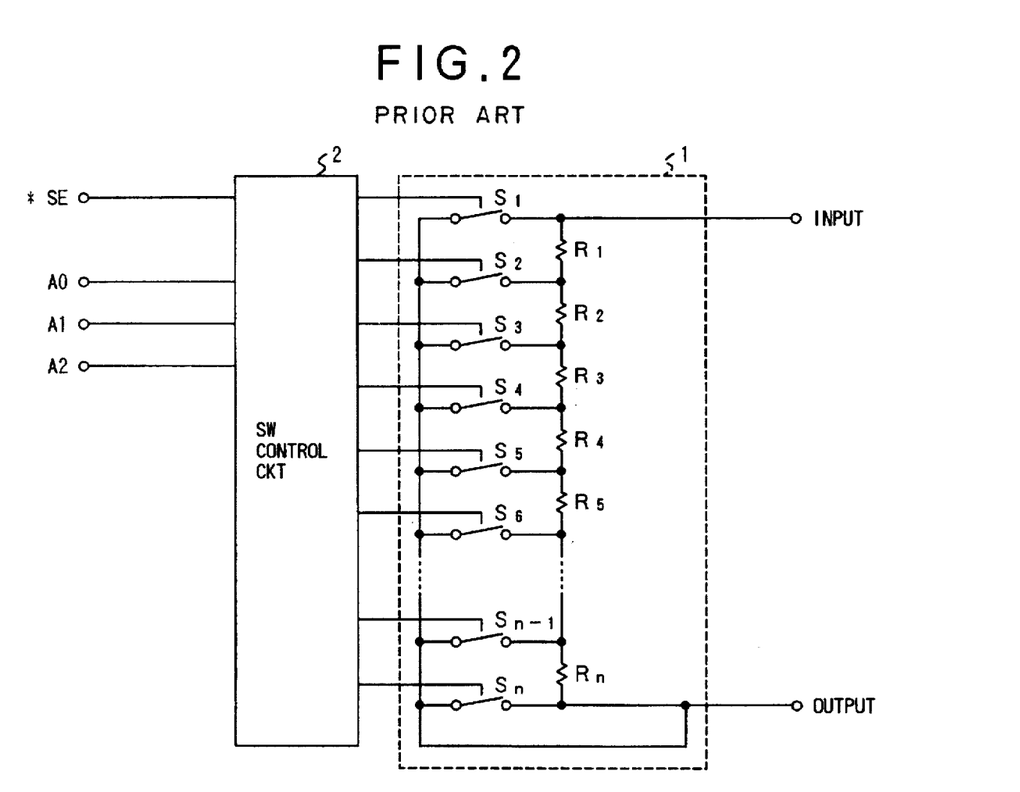
FIG. 2 is a circuit diagram showing the conventional electronic volume controller in more detail.

FIG. 1 shows an example of a conventional electronic volume controller, and FIG. 2 shows the conventional electronic volume controller in more detail.

As shown in FIGS. 1 and 2, the electronic volume controller includes a resistor circuit 1, and a switching control circuit 2 that is made up of resistors R1 through Rn and switches S1 through Sn. A select signal *SE and resistance selection signals A0 through A2 are supplied to the switch control circuit 2.

The resistance circuit 1 changes (or varies) the resistance between the input and output such as audio signals. The switch control circuit 2 generates output signals responsive to the select signal *SE and the resistance selection signals A0 through A2, and the switches S1 through Sn of the resistor circuit 1 are controlled by the output signals of the switch control circuit 2. The select signal *SE is a low-active signal, and the switch control circuit 2 operates during a low-level period of the select signal *SE. The resistance selection signals A0 through A2 are digital signals for selecting the resistance of the resistor circuit 1, and can control the ON/OFF states of up to 8 switches. Hence, the number of resistance selection signals can be determined depending on the number of the switches S1 through Sn of the resistor circuit 1.

As shown in FIG. 2, the resistors R1 through Rn of the resistor circuit 1 are connected in series between the input and output. The switches S1 through Sn are connected in parallel between the input and output, and each of the switches S2 through Sn-1 are connected to corresponding nodes connecting the adjacent resistors, except for the switches S1 and Sn which are respectively connected to nodes of the resistors R1 and Rn connecting to the input and output. The switches S1 through Sn are respectively made up of electronic switches such as field effect transistors (FETs), and are turned ON/OFF responsive to the output signals of the switch control circuit 2.

Next, a description will be given of the operation of varying the resistance of the resistor circuit 1 in the electronic volume controller. First, a value indicated by the digital resistance selection signals A0 through A2 is written into a register (not shown) within the switch control circuit 2 during the low-level period of the select signal *SE. This value that is written into the register is held until the next write operation with respect to the register.

One of the switches S1 through Sn is turned ON depending on the value held in the register, thereby varying the resistance of the resistor circuit 1. Because the electronic volume controller does not have mechanical contacts such as relays, noise such as chattering introduced due to mechanical causes will not be generated.

However, when the digital resistance selection signals A0 through A2 are input to the register of the switch control circuit 2 in order to rewrite the value held in the register and to turn ON one of the switches S1 through Sn, there was a problem in that the digital resistance selection signals A0 through A2 may leak to the output side via the junction capacitance, the stray capacitance or the like of semiconductor devices forming the switches S1 through Sn. As a result, there was a problem in that noise caused by the digital resistance selection signals A0 through A2 are introduced in the output of the electronic volume controller.

SUMMARY OF THE INVENTION

Accordingly, it is a general object of the present invention to provide a novel and useful electronic volume controller in which the problems described above are eliminated.

Another and more specific object of the present invention is to provide an electronic volume controller comprising a resistor circuit receiving an input signal and outputting an output signal, where the resistor circuit has a variable resistance, a switch control circuit controlling the resistance of the resistor circuit depending on resistance selection signals when activated in response to a select signal, and a mute circuit receiving the output signal of the resistor circuit and producing an output signal, where the mute circuit mutes the output signal of the resistor circuit at least during one of times selected from a group consisting of a time when the switch control circuit is activated in response to the select signal to change the resistance of the resistor circuit depending on the resistance selection signals, a time when the switch control circuit is activated in response to the select signal to select a maximum resistance of the resistor circuit depending on the resistance selection signals, and a time when a level of the input signal is approximately zero. According to the electronic volume controller of the present invention, it is possible to prevent the noise that is generated when the resistance of the resistor circuit is varied from being introduced in the output signal of the electronic volume controller. It is also possible to make the output signal of the electronic volume controller exactly zero if necessary. Further, the noise is prevented from being introduced in the output signal of the electronic volume controller when the input signal level is approximately zero.

Still another object of the present invention is to provide an electronic volume controller comprising a first resistor circuit having a variable resistance, a second resistor circuit having a variable resistance, a switch control circuit producing a signal for controlling the resistances of the first and second resistor circuits depending on resistance selection signals when activated in response to a select signal, and switching means, responsive to the select signal, for switching inputs and outputs of the first and second resistor circuits depending on the signal from the switch control circuit, where the switching means varies the resistance of one of the first and second resistor circuits when supplying an input signal to the other of the first and second resistor circuits and outputting an output signal of the other of the first and second resistor circuits. According to the electronic volume controller of the present invention, it is possible to prevent the noise that is generated when the resistance of the resistor circuit is varied from being introduced in the output signal of the electronic volume controller.

Other objects and further features of the present invention will be apparent from the following detailed description when read in conjunction with the accompanying drawings.

DESCRIPTION OF THE PREFERRED EMBODIMENTS

Figure 3:
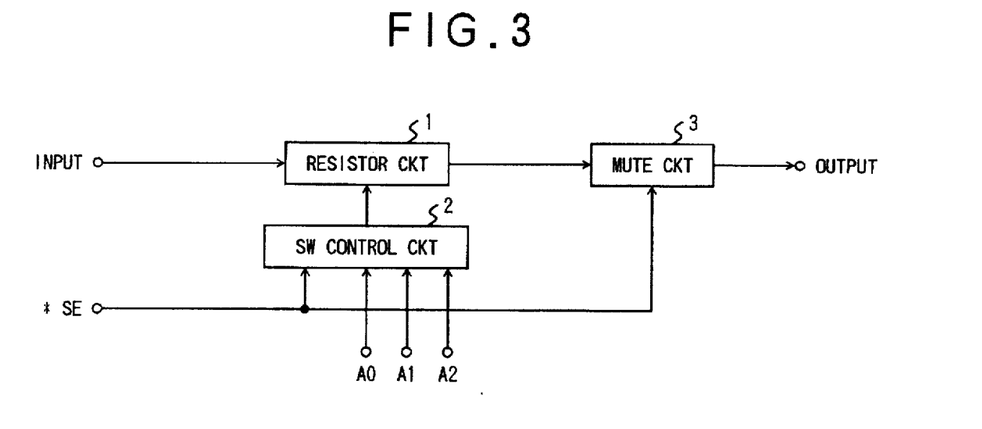
FIG. 3 is a system block diagram for explaining the operating principle of the present invention.

First, a description will be given of the operating principle of the present invention, by referring to FIG. 3. In FIG. 3, those parts which are basically the same as those corresponding parts in FIGS. 1 and 2 are designated by the same reference numerals, and a description thereof will be omitted.

An electronic volume controller shown in FIG. 3 includes a resistor circuit 1, a switch control circuit 2 and a mute circuit 3. The resistance of the resistor circuit 1 is variable, and the switch control circuit 2 variably controls the resistance of the resistor circuit 1. The output of the resistor circuit 1 is input to the mute circuit 3, and the switch control circuit 2 and the mute circuit 3 are controlled by the same select signal *SE.

The input signal such as the audio signal is input to the resistor circuit 1, and the output of the resistor circuit 1 is output via the mute circuit 3. The resistance of the resistor circuit 1 is varied by changing the value held in the register of the switch control circuit 2 by the digital resistance selection signals A0 through A2 when the select signal *SE is input to the switch control circuit 2. The output of the resistor circuit 1 is muted by the mute circuit 3 when the select signal *SE is input to the mute circuit 3.

Accordingly, it is possible to prevent the noise that occurs when the resistance is varied by the switch control circuit 2 from appearing at the output of the electronic volume controller by controlling the mute circuit 3 by the select signal *SE.

Figure 4A:
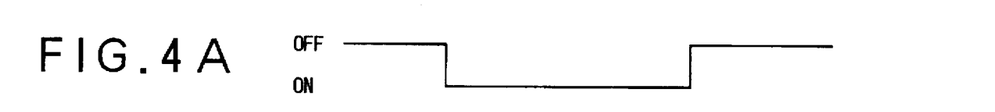
FIG. 4 is timing charts for explaining the operating principle of the present invention.
Figure 4B:
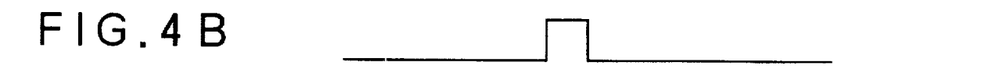
Figure 4C:
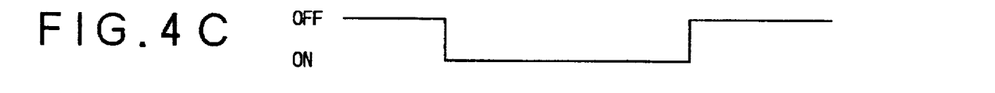
Figure 4D:
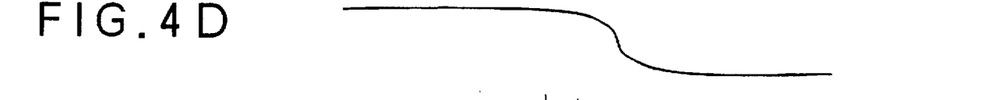
Figure 4E:
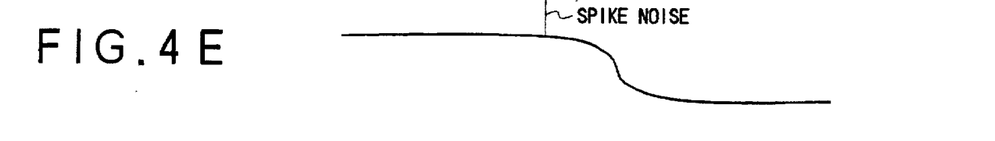

FIGS. 4A through 4E are timing charts for explaining the above described operating principle of the present invention. FIG. 4A shows the select signal *SE, and FIG. 4B shows the timing of the resistance selection signals A0 through A2. FIG. 4C shows the ON/OFF state of the mute circuit 3, and FIG. 4D shows the output of the mute circuit 3. FIG. 4E shows the output of the resistor circuit 1, that is, the output of the electronic volume controller having no mute circuit. Spike noise is generated in the output as shown in FIG. 4E when no mute circuit is provided. However, it may be seen from FIG. 4D that the spike noise is blocked by operating (turning ON) the mute circuit 3. Actually, the output becomes zero (0) when the mute circuit 3 operates, however, the mute circuit 3 is operated for a short time so that the zero output only occurs only for the short time that is difficult to detect by the human ear.

Figure 5:
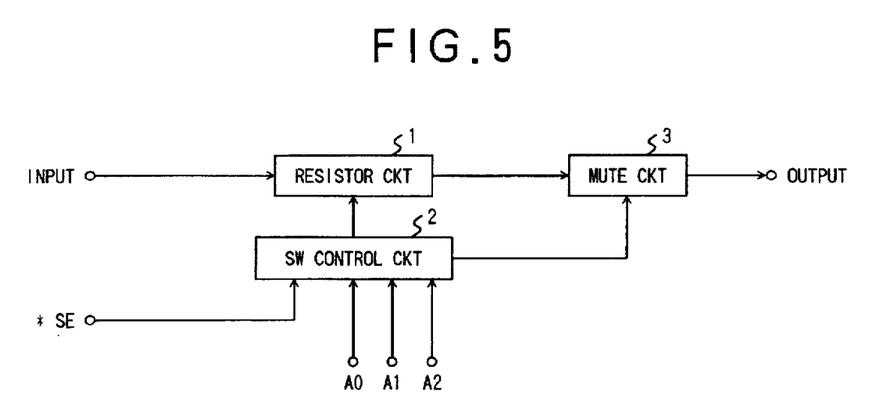
FIG. 5 is a system block diagram showing a first embodiment of an electronic volume controller according to the present invention.

Next, a description will be given of a first embodiment of the electronic volume controller according to the present invention, by referring to FIG. 5. In FIG. 5, those parts which are the same as those corresponding parts in FIG. 3 are designated by the same reference numerals, and a description thereof will be omitted.

An electronic volume controller shown in FIG. 5 includes a resistor circuit 1, a switch control circuit 2 and a mute circuit 3. The mute circuit 3 is operated responsive to an output of the switch control circuit 2 when a value "0" is set in the register of the switch control circuit 2 so as to select a maximum resistance of the resistor circuit 1. Hence, when the value set in the register of the switch control circuit 2 is "0", it is possible to make the output of the electronic volume controller exactly zero (0).

On the other hand, when changing the set value in the register of the switch control circuit 2 from "0" to another value, the operation of the mute circuit 3 is stopped after the change of the set value in the register is completed. As a result, it is possible to prevent a noise from being mixed to the zero (0) output level of the electronic volume controller.

Figure 6A:
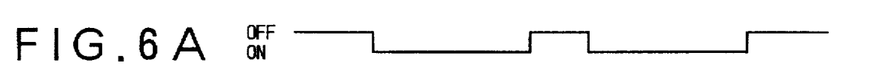
FIG. 6 is timing charts for explaining the operation of the first embodiment.
Figure 6B:
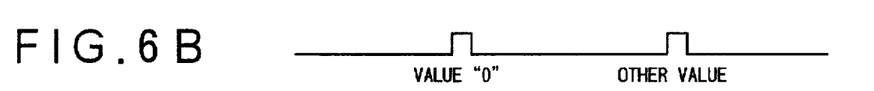
Figure 6C:
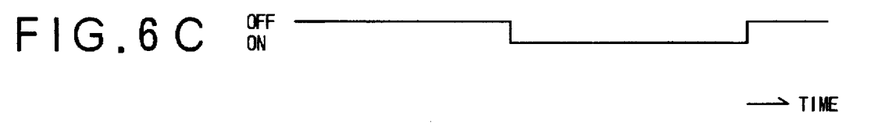

FIGS. 6A through 6C are timing charts for explaining the operation of this first embodiment. FIG. 6A shows the select signal *SE, and FIG. 6B shows the timing of the resistance selection signals A0 through A2. FIG. 6C shows the ON/OFF state of the mute circuit 3. As may be seen from FIG. 6C, the mute circuit 3 is turned ON when the value "0" is set in the register of the switch control circuit 2, and the ON state of the mute circuit 3 is maintained until the change of the set value in the register from the value "0" to another value is completed.

Figure 7:
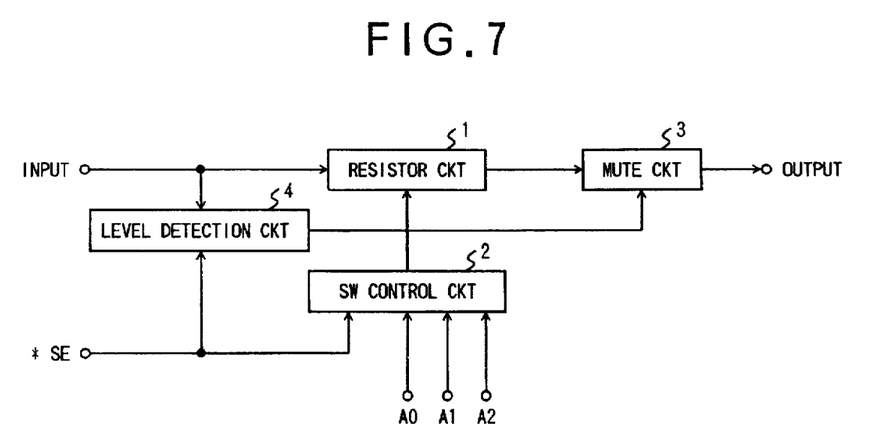
FIG. 7 is a system block diagram showing a second embodiment of the electronic volume controller according to the present invention.

Next, a description will be given of a second embodiment of the electronic volume controller according to the present invention, by referring to FIG. 7. In FIG. 7, those parts which are the same as those corresponding parts in FIG. 3 are designated by the same reference numerals, and a description thereof will be omitted.

An electronic volume controller shown in FIG. 7 includes a resistor circuit 1, a switch control circuit 2, a mute circuit 3 and a level detection circuit 4. The mute circuit 3 mutes the output of the resistor circuit 1 when an output is obtained from the level detection circuit 4. The mute circuit 3 receives the output of the level detection circuit 4 when the level detection circuit 4 detects a zero (0) level input to the resistor circuit 1 and receives a low-level select signal *SE. The level detection circuit 4 detects the zero (0) level also when the input to the resistor circuit 1 has a level less than a predetermined level and close to zero (0).

Accordingly, the noise that is generated when the resistance of the switch control circuit 2 is varied is most conspicuous when the input level is close to zero (0). Hence, in this embodiment, the mute circuit 3 is operated only when the input level is close to zero (0), so as to mute the output of the resistor circuit 1.

Figure 8A:
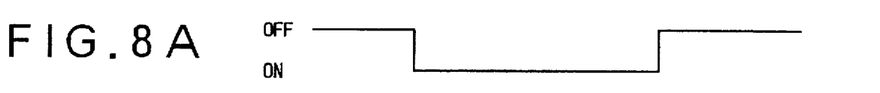
FIG. 8 is timing charts for explaining the operation of the second embodiment.
Figure 8B:
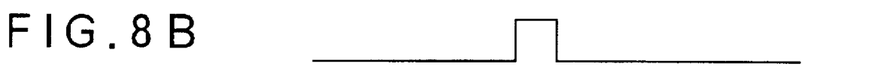
Figure 8C:
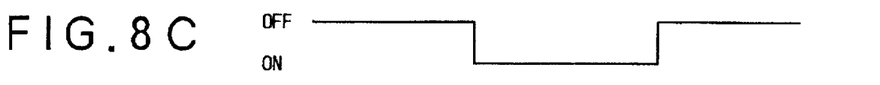
Figure 8D:
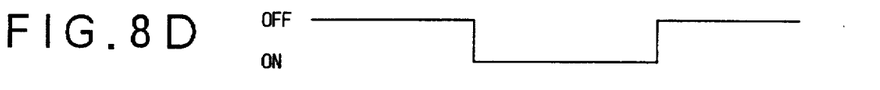
Figure 8E:
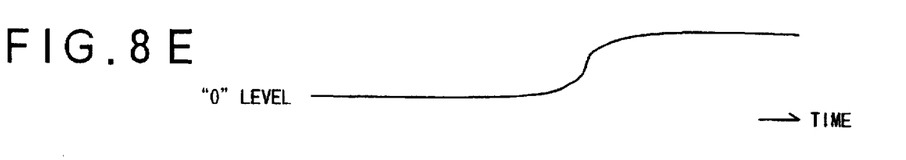

FIGS. 8A through 8E are timing charts for explaining the operation of the second embodiment. FIG. 8A shows the select signal *SE, and FIG. 8B shows the timing of the resistance selection signals A0 through A2. FIG. 8C shows the ON/OFF state of the level detection circuit 4, that is, whether the level detection circuit 4 produces an output or produces no output. FIG. 8D shows the ON/OFF state of the mute circuit 3. FIG. 8E shows the output of the electronic volume controller obtained via the mute circuit 3. As may be seen from FIGS. 8A through 8E, the output of the electronic volume controller is muted until the level adjustment ends only when the signal has a zero (0) level, because the noise that occurs during the zero (0) signal level (silent state) is conspicuous to the human ear.

Figure 9:
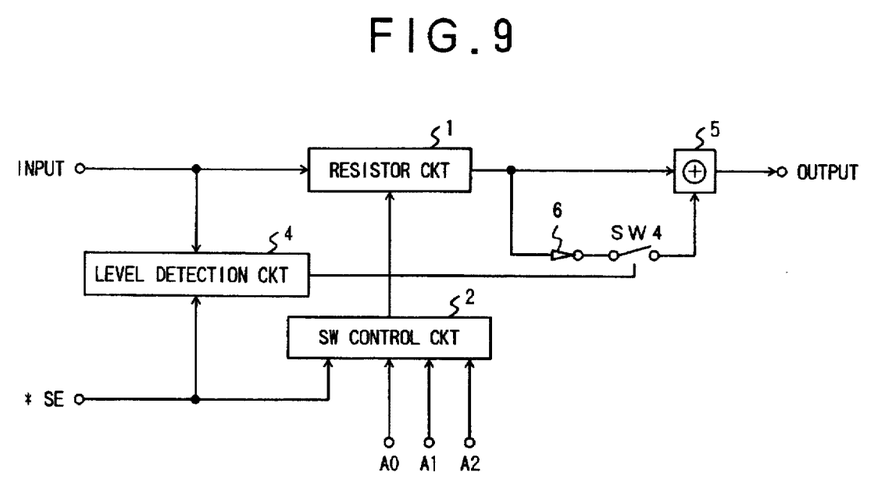
FIG. 9 is a system block diagram showing a third embodiment of the electronic volume controller according to the present invention.

Next, a description will be given of a third embodiment of the electronic volume controller according to the present invention, by referring to FIG. 9. In FIG. 9, those parts which are the same as those corresponding parts in FIG. 7 are designated by the same reference numerals, and a description thereof will be omitted.

In this embodiment, an adder 5, an inverter 6 and a switch SW4 shown in FIG. 9 are used in place of the mute circuit 3. The adder 5 adds the output of the resistor circuit 1 and the output of the resistor circuit 1 obtained via the inverter 6 and the switch SW4. The inverter 6 inverts the output of the resistor circuit 1. The switch SW4 is made up of an electronic switch such as a transistor and a FET, and is controlled by the output of the level detection circuit 4.

Figure 10:
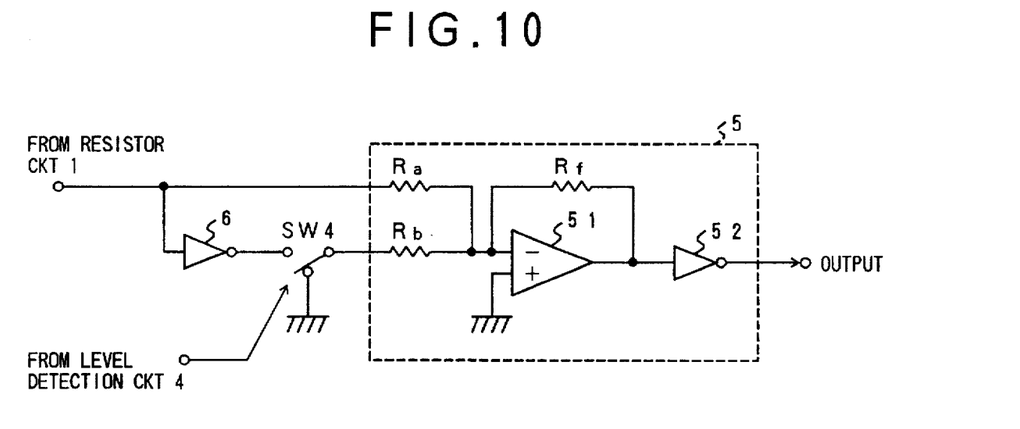
FIG. 10 is a circuit diagram showing an adder used in the third embodiment.

FIG. 10 shows the adder 5 in more detail. The adder shown in FIG. 9 includes an inverting amplifier 51, an inverter 52, two input resistors Ra and Rb, and a feedback resistor Rf. In the following description, it will be assumed for the sake of convenience that the resistances of the input resistors Ra and Rb and the feedback resistor Rf are the same.

When the level detection circuit 4 produces no output in the second embodiment, the switch SW4 is turned OFF. In this state, the output of the resistor circuit 1 is input to the input resistor Ra of the adder and is inverted by the inverting amplifier 51. The output of the inverting amplifier 51 is further inverted by the inverter 52, and the inverter 52 outputs a value that is the same as that input to the input resistor Ra.

On the other hand, when the level detection circuit 4 produces an output, the switch SW4 is turned ON. In this state, the output of the resistor circuit 1 is directly input to the input resistor Ra of the adder 5 on one hand, and is input to the input resistor Rb via the inverter 6 and the switch SW4 on the other. In other words, the output of the resistor circuit 1 is inverted by the inverter 6 and input to the input resistor Rb via the switch SW4. Hence, the adder 5 can mutually cancel the output of the resistor circuit 1 input to the input resistors Ra and Rb.

Therefore, when the level detection circuit 4 produces an output, that is, when varying the resistance of the resistor circuit 1 and the select signal *SE has a low level, it is possible to make the output signal level of the adder 5 to the zero (0) level if the input level to the electronic volume controller is close to zero (0).

Figure 11A:
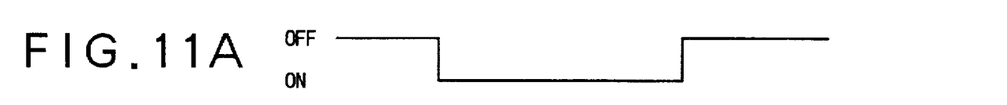
FIG. 11 is timing charts for explaining the operation of the third embodiment.
Figure 11B:
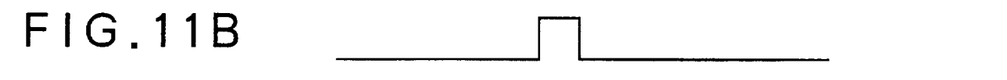
Figure 11C:
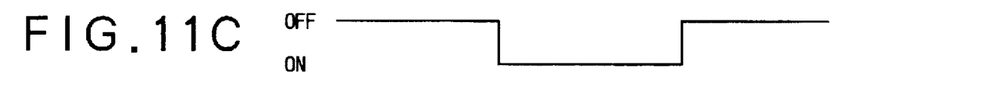
Figure 11D:
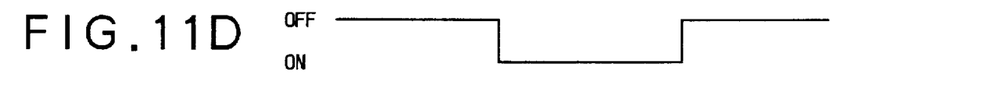
Figure 11E:
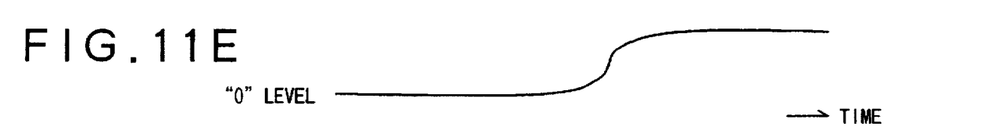

FIGS. 11A through 11E are timing charts for explaining the operation of the third embodiment. FIG. 11A shows the select signal *SE, and FIG. 11B shows the timing of the resistance selection signals A0 through A2. FIG. 11C shows the ON/OFF state of the level detection circuit 4, that is, whether the level detection circuit 4 produces an output or produces no output. FIG. 11D shows the ON/OFF state of the switch SW, that is, whether or not the adder 5 receives the inverted output via the inverter 6. FIG. 11E shows the output of the electronic volume controller obtained via the adder 5. As may be seen from FIGS. 11A through 11E, the output of the electronic volume controller is cancelled by the inverted output and set to zero (0) level when the level detection circuit 4 produces an output, that is, when varying the resistance of the resistor circuit 1 and the select signal *SE has a low level, if the input level to the electronic volume controller is close to zero (0).

Figure 12:
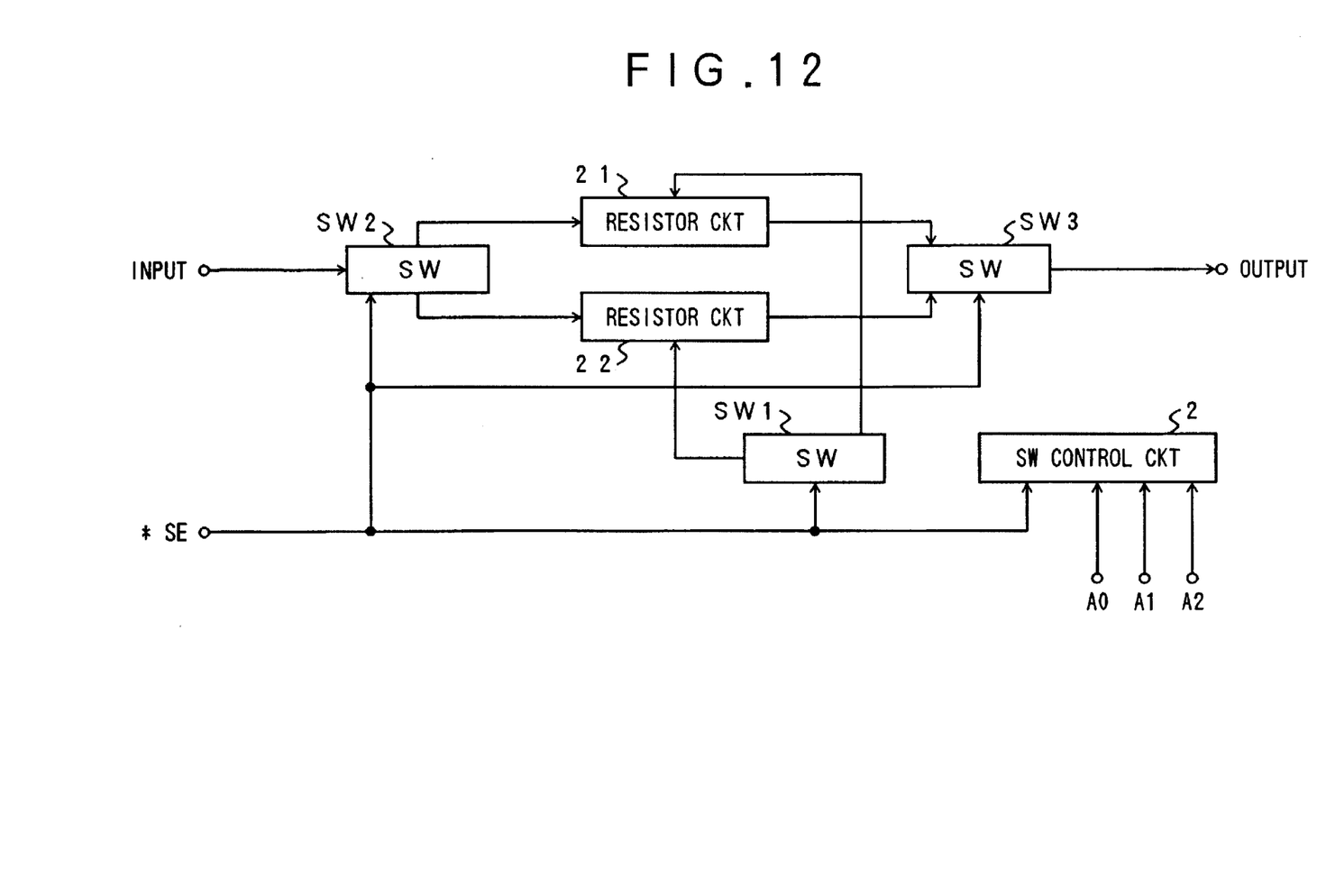
FIG. 12 is a system block diagram showing a fourth embodiment of the electronic volume controller according to the present invention.

Next, a description will be given of a fourth embodiment of the electronic volume controller according to the present invention, by referring to FIG. 12. In FIG. 12, those parts which are the same as those corresponding parts in FIG. 7 are designated by the same reference numerals, and a description thereof will be omitted.

In this embodiment, the electronic volume controller includes a switch control circuit 2, resistor circuits 21 and 22, and switches SW1 through SW3. The resistor circuits 21 and 22 have the same construction, and are constructed similarly to the resistor circuit 1 described above. The value set in the register is changed depending on the resistance selection signals A0 through S2 when the select signal *SE has a low level, and the switch control circuit 2 holds the value set in the register.

The switch SW1 switches and selects which one of the resistor circuits 21 and 22 is to be controlled by the output of the switch control circuit 2. The switches SW2 and SW3 select whether the input such as the audio signal is to be passed through the resistor circuit 21 or the resistor circuit 22.

When the output of the switch control circuit 2 is input to the resistor circuit 21 via the switch SW1, the switches SW2 and SW3 select the resistor circuit 22. On the other hand, when the output of the switch control circuit 2 is input to the resistor circuit 22 via the switch SW1, the switches SW2 and SW3 select the resistor circuit 21. These switches SW1, SW2 and SW3 are switched in response to a rising edge of the select signal *SE.

Accordingly, when the input such as the audio signal is passed through the switch SW2 and the resistor circuit 21 and output via the switch SW3, the switch control circuit 2 controls the resistance of the resistor circuit 22 via the switch SW1. On the other hand, when the input is passed through the switch SW2 and the resistor circuit 22 and output via the switch SW3, the switch control circuit 2 controls the resistance of the resistor circuit 21 via the switch SW1.

As a result, the switch control circuit 2 always varies the resistance of the resistor circuit that is not in use. In other words, when the input is being passed through one resistor circuit, the switch control circuit 2 varies the resistance of the other resistor circuit. For this reason, it is possible to prevent noise that is generated when varying the resistance of the resistor circuit 21 or 22 from being introduced in the output of the electronic volume controller.

Figure 13:
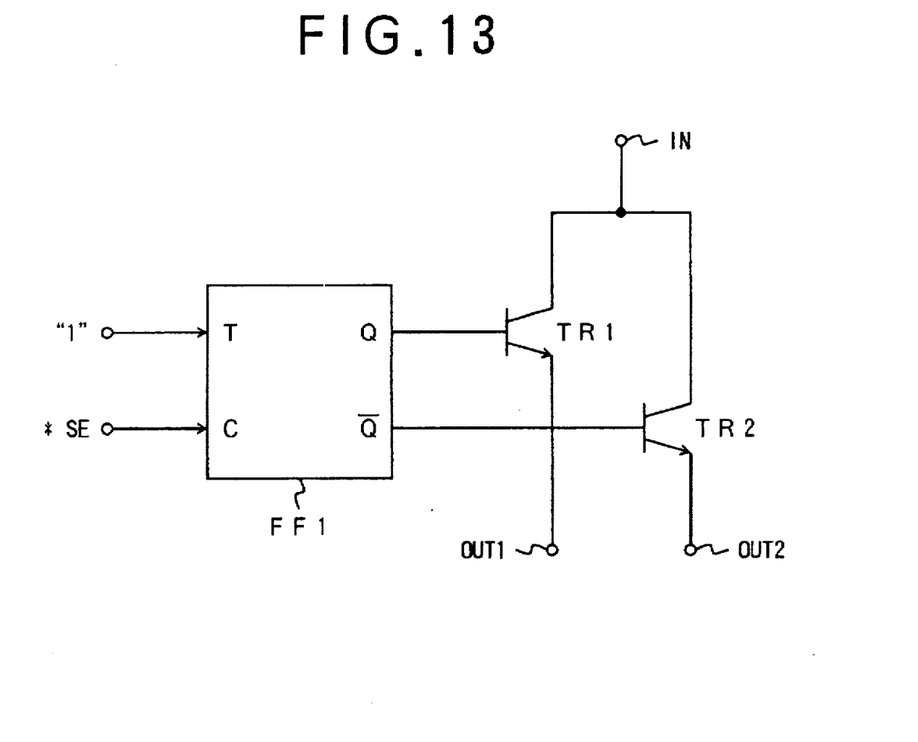
FIG. 13 is a circuit diagram showing switches used in the fourth embodiment.
Figure 14:
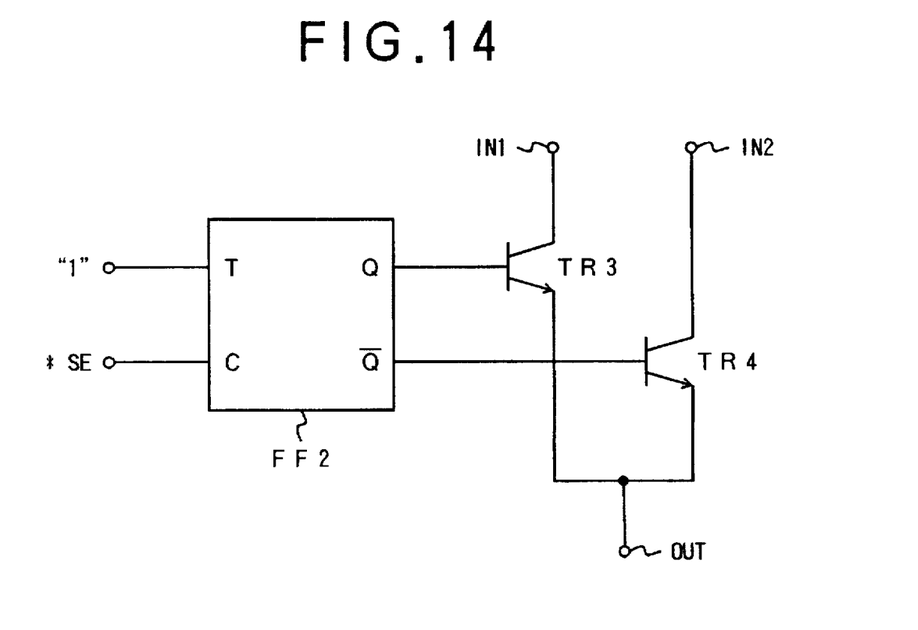
FIG. 14 is a circuit diagram showing another switch used in the fourth embodiment.

FIG. 13 shows the construction of the switches SW1 and SW2 shown in FIG. 12, and FIG. 14 shows the construction of the switch SW3 shown in FIG. 12.

In FIG. 13, the switch SW1 or SW2 includes a synchronous trigger (T) flip-flop FF1, and transistors TR1 and TR2. The flip-flop FF1 has a trigger input terminal T, a clock input terminal C, and output terminals Q and /Q (Q bar). A signal value "1" (or high level) is constantly input to the trigger input terminal T, and the select signal *SE is input to the clock input terminal C. An output of the flip-flop FF1 obtained from the output terminal Q is input to a base of the transistor TR1, and an output of the flip-flop FF1 obtained from the output terminal /Q is input to a base of the transistor TR2. The output obtained from the output terminal /Q is an inverted signal of the output obtained from the output terminal Q. The outputs of the flip-flop FF1 obtained from the output terminals Q and /Q are inverted in response to the rising edge of the select signal :SE.

The transistor TR1 turns ON when the output value from the output terminal Q is "1", and turns OFF when the output value from the output terminal Q is "0". Similarly, the transistor TR2 turns ON when the output value from the output terminal /Q is "1", and turns OFF when the output value from the output terminal Q is "0".

In the case of the switch SW1, the output of the switch control circuit is connected to an input terminal IN shown in FIG. 13. In addition, an output terminal OUT1 is connected to the resistor circuit 22, and an output terminal OUT2 is connected to the resistor circuit 21. The number of the transistors TR1 and TR2 is equal to the number of switches S1 through Sn within the resistor circuits 21 and 22. The switches S1 through Sn are shown in FIG. 2 described above.

In the case of the switch SW1, the input such as the audio signal is input to the input terminal IN shown in FIG. 13. In addition, the output terminal OUT1 is connected to the resistor circuit 21, and the output terminal OUT2 is connected to the resistor circuit 22.

In FIG. 14, the switch SW3 includes a synchronous trigger (T) flip-flop FF2, and transistors TR3 and TR4. The operation of the flip-flop FF2 and the transistors TR3 and TR4 are basically the same as the flip-flop FF1 and the transistors TR1 and TR2 shown in FIG. 13, and a description thereof will be omitted. An input IN1 shown in FIG. 14 is connected to the output of the resistor circuit 21, and an input IN2 is connected to the output of the resistor circuit 22. An output terminal OUT corresponds to the output terminal of the electronic volume controller.

Figure 15:
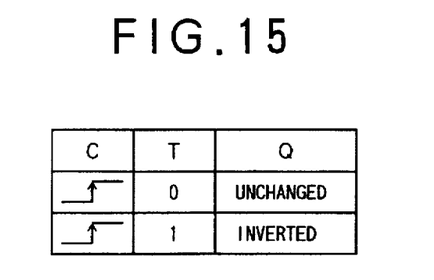
FIG. 15 is a diagram showing a truth table of a synchronous trigger flip-flop used in the fourth embodiment.
Figure 16:
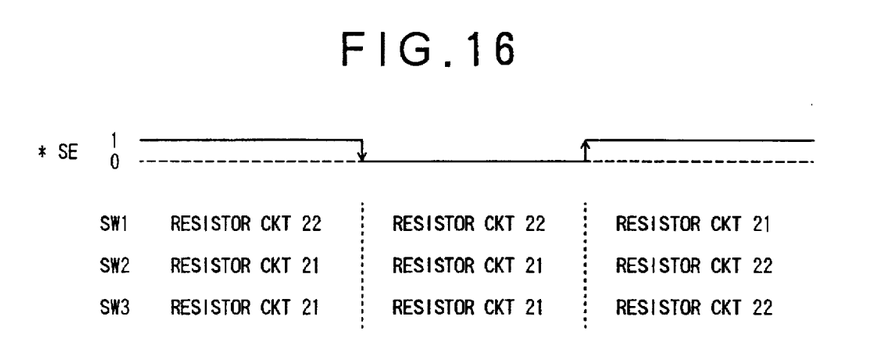
FIG. 16 is a diagram for explaining selection states of the switches used in the fourth embodiment.

FIGS. 15 and 16 are diagrams for explaining the operation of the switches SW1 through SW3 of the fourth embodiment. FIG. 15 shows a truth table of the synchronous trigger (T) flip-flop, and FIG. 16 shows a diagram for explaining selection states of the switches SW1 through SW3.

The truth table shown in FIG. 15 applies to the flip-flops FF1 and FF2 shown in FIGS. 13 and 14. The input to the clock input terminal C indicates the rising edge for both cases. When the input to the trigger input terminal T is "0", the output from the output terminal Q does not change. But when the input to the trigger input terminal T is "1", the output from the output terminal Q is inverted.

The operation of the fourth embodiment will now be described with reference to FIG. 16.

For example, it is assumed for the sake of convenience that, initially, the select signal *SE is "1" and the resistor circuit 21 is being used in the fourth embodiment, the switch SW1 is connected to the side of the resistor circuit 22, and the switches SW2 and SW3 are connected to the side of the resistor circuit 21, as shown in FIG. 16.

In this state, when the value of the resistor in the switch control circuit 2 is changed so as to vary the resistance of the resistor circuit, the rewriting of the value of the register is started at the falling edge of the select signal *SE and is ended at the rising edge of the select signal *SE. The switch SW1 is switched and connected to the side of the resistor circuit 21 at the rising edge of the select signal *SE, and the switches SW2 and SW3 are switched and connected to the side of the resistor circuit 22 at this rising edge of the select signal *SE.

In FIGS. 13 and 14, NPN transistors are used as the transistors TR1 through TR4. However, it is of course possible to use PNP transistors or field effect transistors (FETs) as the transistors TR1 through TR4. In addition, it is also possible to use both NPN transistors and PNP transistors as the transistors TR1 through TR4, so as to obtain the output from one of the output terminals Q and /Q of the flip-flop FF1 or FF2.

Figure 17A:
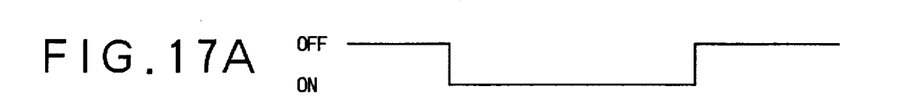
FIG. 17 is timing charts for explaining the operation of the fourth embodiment.
Figure 17B:
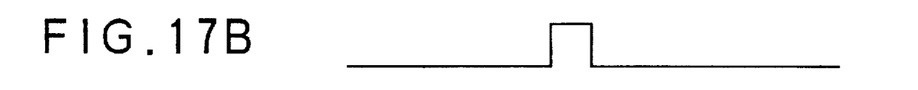
Figure 17C:
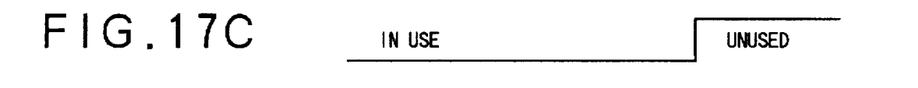
Figure 17D:
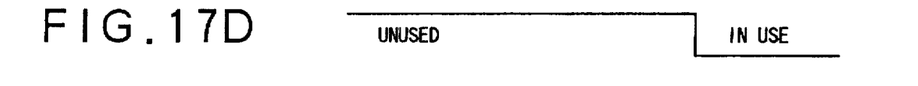
Figure 17E:
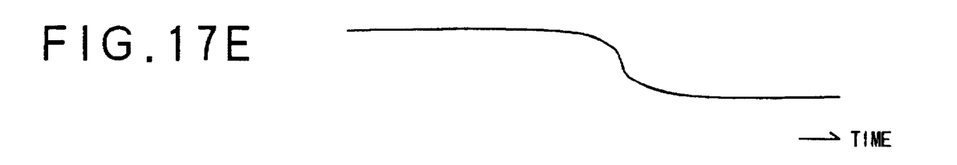

FIGS. 17A through 17E are timing charts for explaining the operation of the fourth embodiment. FIG. 17A shows the select signal *SE, and FIG. 17B shows the timing of the resistance selection signals A0 through A2. FIG. 17C shows the used/unused state of the resistor circuit 21, and FIG. 17D shows the used/unused state of the resistor circuit 22. FIG. 17E shows the output of the electronic volume controller obtained via the switch SW3. As may be seen from FIGS. 17A through 17E, the resistance of the unused resistor circuit used is varied when changing the level, and the used resistor circuit and the unused resistor circuit are switched after the resistance is varied.

Figure 18:
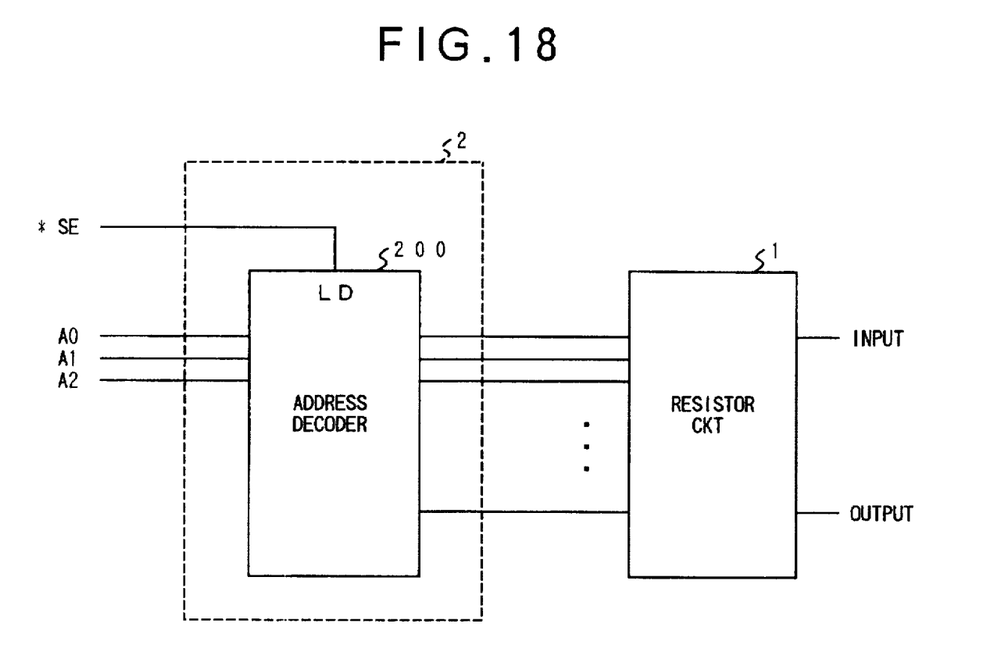
FIG. 18 is a system block diagram showing the construction of the switch control circuit.

FIG. 18 shows the construction of the switch control circuit 2 that is used in the embodiments described above.

The switch control circuit 2 shown in FIG. 18 includes an address decoder 200 having a load terminal LD which receives the select signal *SE. The resistance selection signals A0 through A2 are input to address input terminals of the address decoder 200. The address decoder 200 decodes the resistance selection signals A0 through A2 which are input as address signals in response to the select signal *SE input to the load terminal LD, and outputs decoded signals which controls the ON/OFF states of the switches within the resistor circuit 1.

For example, it is possible to use as the switch control circuit 2 a known semiconductor chip which basically has the construction shown in FIG. 18.

Figure 19:
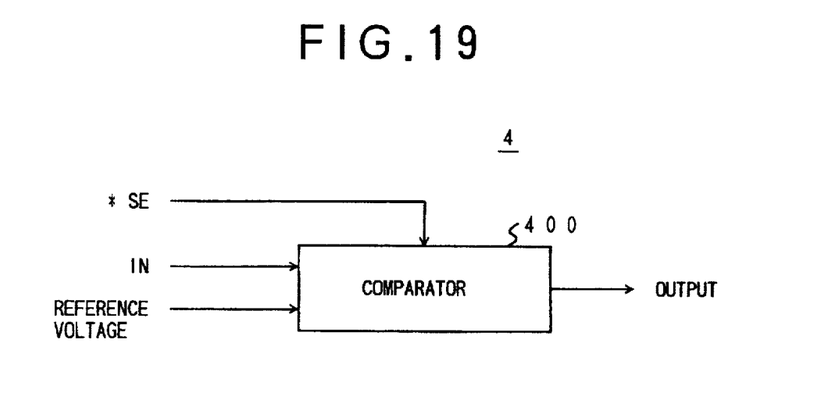
FIG. 19 is a system block diagram showing the construction of the level detection circuit.

FIG. 19 shows the construction of the level detection circuit 4 that is used in the embodiments described above.

The level detection circuit 4 shown in FIG. 19 includes a comparator 400. The comparator 400 compares an input signal IN and a reference voltage of 0 V, for example, in response to the select signal *SE. An output signal of the comparator 400 is dependent on whether or not the input signal IN and the reference voltage match. This output signal of the comparator 400 is supplied to the mute circuit 3 in the case of the embodiment shown in FIG. 7.

For example, it is possible to use as the level detection circuit 4 a known semiconductor chip which basically has the construction shown in FIG. 19.

In each of the embodiments described above, the time in which the resistance of the resistor circuit is varied, that is, the time in which the value of the resistor within the switch control circuit is changed, is set within a predetermined range so that the discontinuity of the sound is not conspicuous to the human ear. For example, this time is set to approximately 50 μs or less.

In the described embodiments, the select signal *SE is a low-active signal that is active when it has the value "0". But of course, a high-active signal that is active when it has the value "1" may also be used as the select signal *SE.

Moreover, the construction of the resistor circuit is not limited to that described above.

In addition, it is possible to arbitrarily combine the embodiments.

Further, the present invention is not limited to these embodiments, but various variations and modifications may be made without departing from the scope of the present invention.

What is claimed is:

1. An electronic volume controller comprising:

a resistor circuit receiving an input signal and outputting an output signal, said resistor circuit having a variable resistance;

a switch control circuit, operably coupled to said resistor circuit, for controlling the resistance of said resistor circuit depending on resistance selection signals when activated in response to a single select signal; and a mute circuit, operably coupled to said resistor circuit, for receiving the output signal of said resistor circuit and said single select signal to which said switch control circuit responds, and for producing an output signal in response to said single select signal, said mute circuit muting the output signal of said resistor circuit at least during one of times selected from a group consisting of a time when said switch control circuit is activated in response to the select signal to change the resistance of said resistor circuit depending on the resistance selection signals, a time when said switch control circuit is activated in response to the select signal to select a maximum resistance of said resistor circuit depending on the resistance selection signals, and a time when a level of the input signal is approximately zero.

2. The electronic volume controller as claimed in claim 1, wherein said mute circuit passes the output signal of said resistor circuit as it is when inactive, and mutes the output signal of said resistor circuit when activated in response to the select signal, so that noise generated when varying the resistance of said resistor circuit is prevented from leaking into the output signal of said mute circuit.

3. The electronic volume controller as claimed in claim 2, wherein said switch control circuit stores the resistance selection signals and the stored resistance selection signals are changeable only when activated in response to the select signal.

4. The electronic volume controller as claimed in claim 1, wherein said mute circuit mutes the output signal of said resistor circuit in response to a signal from said switch control circuit when said switch control circuit is activated in response to the select signal to select the maximum resistance of said resistor circuit depending on the resistance selection signals.

5. The electronic volume controller as claimed in claim 1, which further comprises:

a level detection circuit detecting the level of the input signal and outputting a signal when the detected level is approximately zero, said mute circuit muting the output signal of said resistor circuit in response to the signal from said level detection circuit.

6. The electronic volume controller as claimed in claim 5, wherein said mute circuit includes means for inverting the output signal of said resistor circuit, and means for mutually cancelling the output signal and an inverted output signal of said resistor circuit in response to the signal from said level detection circuit.

7. The electronic volume controller as claimed in claim 1, wherein said input signal is an audio signal, and the resistance of said resistor circuit is varied within a predetermined time so that a discontinuity in sound produced from said audio signal is inconspicuous to human ear.

8. An electronic volume controller comprising:

a first resistor circuit having a variable resistance;

a second resistor circuit having a variable resistance;

a switch control circuit producing a signal for controlling the resistances of said first and second resistor circuits depending on resistance selection signals when activated in response to a select signal; and switching means, responsive to the select signal, for switching inputs and outputs of said first and second resistor circuits depending on the signal from said switch control circuit, said switching means varying the resistance of one of said first and second resistor circuits when supplying an input signal to the other of said first and second resistor circuits and outputting an output signal of said other of said first and second resistor circuits.

9. The electronic volume controller as claimed in claim 8, wherein said input signal is an audio signal, the resistance of said one of said resistor circuit is varied is within a predetermined time so that a discontinuity in sound produced from said audio signal is inconspicuous to human ear.

* * * * *